(12) United States Patent
Hedler et al.

(10) Patent No.: US 7,340,826 B2
(45) Date of Patent: *Mar. 11, 2008

(54) METHOD FOR PRODUCING AN ELECTRONIC DEVICE CONNECTED TO A PRINTED CIRCUIT BOARD

(75) Inventors: Harry Hedler, Germering (DE); Jörg Zapf, München (DE)

(73) Assignee: Infineon Technologies AG, Munich (DE)

( * ) Notice: Subject to any disclaimer, the term of this patent is extended or adjusted under 35 U.S.C. 154(b) by 394 days.

This patent is subject to a terminal disclaimer.

(21) Appl. No.: 11/008,081

(22) Filed: Dec. 9, 2004

(65) Prior Publication Data

US 2005/0150685 A1 Jul. 14, 2005

Related U.S. Application Data

(62) Division of application No. 10/105,467, filed on Mar. 26, 2002, now Pat. No. 6,852,931.

(30) Foreign Application Priority Data

Jun. 26, 2001 (DE) ................ 101 14 897

(51) Int. Cl.
*B23P 19/00* (2006.01)
*H01L 29/40* (2006.01)
*H05K 1/16* (2006.01)

(52) U.S. Cl. ............ 29/740; 29/832; 29/841; 29/843; 29/846; 257/777; 174/260

(58) Field of Classification Search ............ 29/840, 29/832, 841, 843, 845, 846, 842; 174/260, 174/261, 256, 258, 262; 361/760, 762, 761; 257/780, 786, 774, 777; 438/613, 614, 612
See application file for complete search history.

(56) References Cited

U.S. PATENT DOCUMENTS

| 4,565,734 A | 1/1986 | Arai et al. |
| 4,599,243 A | 7/1986 | Sachdev et al. |

(Continued)

FOREIGN PATENT DOCUMENTS

JP  357099749 A  6/1982

(Continued)

*Primary Examiner*—A. Dexter Tugbang
*Assistant Examiner*—Tai Van Nguyen
(74) *Attorney, Agent, or Firm*—Laurence A. Greenberg; Werner H. Stemer; Ralph E. Locher

(57) ABSTRACT

A configuration and also a method for the configuration in which, the configuration has at least one electronic device with associated contact connections and at least one printed circuit board with external contacts. The printed circuit board is electrically coupled to the electronic device. At least the metallic surfaces of the configuration are covered by a plasma-polymerized polymer layer.

16 Claims, 1 Drawing Sheet

U.S. PATENT DOCUMENTS

| | | | |
|---|---|---|---|
| 4,615,908 A | 10/1986 | Behn et al. | |
| 4,842,989 A | 6/1989 | Taniguchi et al. | |
| 5,274,913 A | 1/1994 | Grebe et al. | |
| 5,461,545 A | 10/1995 | Leroy et al. | |
| 5,539,250 A | 7/1996 | Kitano et al. | |
| 5,578,869 A | 11/1996 | Hoffman et al. | |
| 5,659,203 A * | 8/1997 | Call et al. | 257/778 |
| 5,956,605 A | 9/1999 | Akram et al. | |
| 5,977,641 A | 11/1999 | Takahashi et al. | |
| 6,093,972 A * | 7/2000 | Carney et al. | 257/790 |
| 6,281,450 B1 | 8/2001 | Urasaki et al. | |
| 6,285,083 B1 * | 9/2001 | Imai et al. | 257/773 |
| 6,495,462 B1 * | 12/2002 | Haba et al. | 438/689 |
| 6,555,414 B1 * | 4/2003 | Vanfleteren et al. | 438/108 |

FOREIGN PATENT DOCUMENTS

| | | |
|---|---|---|
| JP | 357172741 A | 10/1982 |
| JP | 358093241 A | 6/1983 |
| JP | 63311794 A | 12/1988 |
| JP | 04219901 A | 8/1992 |
| JP | 06244316 A | 9/1994 |
| JP | 11-46053 | 2/1999 |

* cited by examiner

METHOD FOR PRODUCING AN ELECTRONIC DEVICE CONNECTED TO A PRINTED CIRCUIT BOARD

This is a divisional application of application Ser. No. 10/105,467, now U.S. Pat. No. 6,852,931 filed Mar. 26, 2002; the application also claims the priority, under 35 U.S.C. §119, of German patent application DE 101 14 897.6, filed Mar. 26, 2001; the prior applications are herewith incorporated by reference in their entirety.

BACKGROUND OF THE INVENTION

Field of the Invention

The invention relates to a configuration having an electronic device that is electrically connected to an associated printed circuit board or rewiring board, and to a method for producing the configuration.

When soldering an electronic device on a printed circuit board, solder is heated at the connecting point of the device with the conductor track, and the solder flows to ensure a fixed mechanical and electrical connection. However, during the soldering process, care must be taken to ensure that the solder is limited to the connection contacts, since otherwise there is the risk of the solder flowing away by wetting the connection conductor tracks adjoining the connection contacts. The result of this would be that, at the actual soldering point, too little solder would remain for a reliable connection of the two participants.

In order to prevent solder from flowing away to adjoining conductor tracks, it is known to cover the adjoining conductor tracks with a resist, a so-called soldering stop resist, or else with a suitable sheet.

A further known measure is to use different metals for the conductor tracks and for the connection contacts. Only the connection contacts are composed of a metal which can be wetted with solder. Appropriate metals of this type are, for example, copper, silver or gold. By contrast, the surface of the conductor tracks may be composed of a metal that cannot be wetted by solder, for example, aluminum or titanium.

Finally, it is also possible to arrange the conductor track in a deeper plane than the connection contact, and to provide a through connection, a so-called via, for the purpose of connecting the conductor track and the connection contact. However, a configuration of this type is possible only in the case of multilayer circuits.

SUMMARY OF THE INVENTION

It is accordingly an object of the invention to provide a configuration with an electronic device and an associated rewiring board and a method of producing the configuration which overcomes the above-mentioned disadvantages of the prior art apparatus and methods of this general type.

In particular, it is an object of the invention to ensure a reliable electrical connection between the connection contacts of an electronic device and the conductor tracks of the rewiring board.

With the foregoing and other objects in view there is provided, in accordance with the invention, a configuration, that includes: at least one electronic device having associated contact connections; at least one printed circuit board having external contacts; metallic surfaces; and a plasma-polymerized polymer layer covering at least the metallic surfaces. The printed circuit board is electrically coupled to the electronic device.

The configuration has the advantage that the plasma-polymerized polymer layer, during the soldering process, effectively prevents the solder from flowing-away from contact-making points to adjoining conductor tracks of the component and of the rewiring or printed circuit board. In addition, the plasma-polymerized polymer layer can ensure effective corrosion protection of the metallic surfaces.

In accordance with an added feature of the invention, all of the surfaces of the at least one electronic device and of the at least one printed circuit board are covered by the plasma-polymerized polymer layer. This embodiment has the advantage, in particular, that an optimum corrosion protection of all the devices, and in particular, of the metallic surfaces can be ensured.

In accordance with an additional feature of the invention, at least one electronic device is a semiconductor chip. Particularly when soldering semiconductor chips with their very small and very numerous electrical soldered connections, it must be ensured that not too much solder has to be liquefied at the soldering points, in order that the semiconductor chips are heated for as short a time as possible in order not to incur any damage. Flowing-away of the solder onto the conductor tracks of a rewiring board would require using more solder and longer heating, so that a coating with a polymer layer is advantageous, in particular, in the case of such configurations.

In accordance with another feature of the invention, the polymer layer is partly burned and/or vaporized at soldering points of electrical contacts. This has the advantage that the individual parts to be soldered can already be covered with the polymer layer before the soldering operation. The polymer layer can be burned and/or vaporized in a simple manner during the soldering process because of the applied temperature required for soldering. In this way, the polymer layer acts as a soldering stop layer and enables effective corrosion protection after the soldering process.

In accordance with a further feature of the invention, all of the soldering points of the electrical contacts are completely encapsulated by the polymer layer in an airtight manner. This can be achieved, in particular, by removing the polymer layer before soldering at the corresponding contact pads. Afterward, the participants are soldered together, the polymer layer acting as a reliable soldering stop layer. This configuration has the advantage, moreover, that the soldering points are subsequently enclosed virtually completely by the polymer coating, whereby effective corrosion protection is again ensured.

In accordance with a further added feature of the invention, the polymer layer has a layer thickness of at least 5 nanometers (nm), thereby ensuring that even in the case of longer-chain polymers in the layer, all of the devices are reliably covered with a multiplicity of atomic layers.

In accordance with a further additional feature of the invention, the polymer layer has a layer thickness of between 5 and 50 nanometers. This has the advantage that, on the one hand, a minimum layer thickness is present, which ensures a reliable and closed coating even in the case of very long-chain polymers in the polymer layer. On the other hand, the layer thickness is limited in such a way that the plasma polymer layer does not impede the soldering operation in the case of a contact with the soldering paste.

In accordance with yet an added feature of the invention, the polymer layer is a polytetrafluoroethylene-containing (teflon-containing) polymer layer. A proportion of polytetrafluoroethylene in the polymer layer, which proportion is introduced during the plasma coating and is not too small, has the advantage that a particularly temperature-resistant layer can be realized that cannot melt or burn under the heat produced during soldering, so that the coating can remain completely intact even in direct proximity to the soldering points.

In accordance with yet an additional feature of the invention, the polymer layer is a silicone-containing polymer layer. A proportion of silicones in the polymer layer, which proportion is introduced during the plasma coating and is not too small, has the advantage that, in this way, it is possible to realize a particularly flexible and tough and hence mechanically resistant connection for the coating.

In accordance with yet another feature of the invention, the configuration can include a plurality of semiconductor chips that are connected to one another in a three-dimensional topography. The advantages of the plasma-polymerized polymer coating are beneficial in particular in the case of such a three-dimensional, i.e. e.g. multilayer, configuration of semiconductor chips and rewiring boards assigned thereto. Since the coating can be applied uniformly everywhere even in the case of angled and poorly accessible multilayer structures, a coating that acts as a soldering stop layer and that can prevent the solder from flowing away to conductor tracks is present at all desired points.

In accordance with yet a further feature of the invention, the three-dimensional structure is produced by soldering the semiconductor chips with connecting sections. Such connecting sections may be e.g. three-dimensional printed circuit boards or rewiring boards. A polymer coating of a structure of this type has the advantage that a uniform coating can be effected even in the case of otherwise inaccessible points that could be reached only with difficulty, if at all, by using a soldering stop resist.

In accordance with yet a further added feature of the invention, the three-dimensional structure is formed in the form of so-called molded interconnect devices. The latter are understood to be three-dimensional structures of semiconductor chips that are electrically and mechanically connected to one another. What was described above applies here as well, namely that by using plasma polymerization, these three-dimensional structures can be coated significantly more easily than they can be resist-coated, for example. Consequently, these structures can be reliably encapsulated with a layer that prevents the solder from flowing to conductor tracks.

With the foregoing and other objects in view there is also provided, in accordance with the invention, a method for producing a configuration having at least one electronic device that is electrically coupled to at least one printed circuit board. The method includes steps of: providing a configuration having at least one electronic device with associated contact connections and at least one printed circuit board with external contacts; using a soldering paste to mask the external contacts; introducing the configuration into a plasma chamber; applying a polymer layer, at least to metallic surfaces of the configuration, using plasma polymerization; removing the configuration from the plasma chamber; if necessary, removing the polymer layer from the contacts of the printed circuit board and from the contact connections of the electronic device; and soldering the contacts of the printed circuit board and the contact connections of the electronic device together such that, in the configuration, the printed circuit board and the electronic device are electrically coupled together.

In other words, first, the individual parts of the configuration that will be soldered are provided, after which, all of the connection contacts of the configuration that will be soldered are masked with a soldering paste. The individual parts prepared in this way are subsequently introduced individually or jointly into a plasma chamber, where a polymer layer is applied to the configuration by using plasma polymerization. Afterward, the configuration or the individual parts thereof are removed again from the plasma chamber. The polymerization can be removed at the contact points that will be soldered. Finally, the electrical connections of the configuration are soldered to one another.

This method has the advantage that all of the soldering points that will be contact-connected and all of the remaining metallic layers and conductor tracks are covered by a polymer layer that prevents the solder from flowing onto the conductor tracks. As a result of the coating in the plasma chamber, during which, monomers and/or short-chain hydrocarbons polymerize to form longer-chain polymers under the action of an electric field, even angled and more complicated structures can be coated uniformly. Such angled or more complicated structures could be reached only with difficulty or only partially by using resist coating, for example.

With the foregoing and other objects in view there is also provided, in accordance with the invention, an alternate embodiment of a method for producing a configuration having at least one electronic device that is electrically coupled to at least one printed circuit board. The method includes steps of: providing a configuration having at least one electronic device with associated contact connections and at least one printed circuit board with external contacts; using a soldering paste to mask the external contacts of the printed circuit board; contact-connecting the contact connections of the electronic device to the external contacts of the printed circuit board; introducing the configuration into a plasma chamber; applying a polymer layer, at least to metallic surfaces of the configuration, using plasma polymerization; removing the configuration from the plasma chamber; and soldering the contacts of the printed circuit board and the contact connections of the electronic device together such that, in the configuration, the printed circuit board and the electronic device are electrically coupled together.

In other words, this embodiment of the method includes at least the following method steps. The individual parts of the configuration that will be soldered together are provided, and subsequently all of the connection contacts of the configuration that will be soldered are masked with a soldering paste. The contact points that will later be soldered are contact-connected. Afterward, the configuration is introduced into a plasma chamber and a polymer layer is applied to the configuration using plasma polymerization. Afterward, the configuration is removed from the plasma chamber, and the electrical connections are soldered.

In this alternate embodiment, all parts are first contact-connected, and only afterward are covered with a polymer layer using plasma polymerization. This has the advantage that the soldering points that will be connected are already in touching contact with one another and can easily be soldered to one another without having to remove the polymer layer beforehand at these points. By contrast, a polymer layer that prevents the solder from flowing to the conductor tracks is present at the metallic areas directly adjoining the soldering points.

In the first exemplary embodiment of the method, during the plasma polymerization, all of the surfaces of the at least one electronic device and of the at least one printed circuit board are covered by the polymer layer. This not only provides the advantage of reliable corrosion protection, but also provides the further advantage that the coating can be applied very rapidly and effectively in this way. This makes it possible to achieve good protection against pointwise exposure of metallic areas because of chips or infiltrations of the layer.

In accordance with an added mode of the invention, during the plasma polymerization, monomers and/or short-chain prepolymers are polymerized in the plasma chamber to form longer-chain hydrocarbons. This has the advantage that the process can be influenced and monitored in a very reliable manner, so that the coating may include polymers having a specific desired molecular length or size. Moreover, in this way, silicones and/or polytetrafluoroethylenes can be introduced into the plasma chamber in addition to the monomers and/or the short-chain prepolymers, as a result of which, the physical properties of the polymer layer can be influenced in a highly targeted manner.

In accordance with an additional mode of the invention, the masking can be preformed using screen printing. This enables the solder paste to be very precisely positioned on the points to be soldered, in which case the screen can be prepared and configured differently for different structures.

In accordance with another mode of the invention, the masking can be performed using stencil printing. This enables the solder paste to be exactly applied to the points of the configuration that are to be contact-connected.

In accordance with a further mode of the invention, the masking can be performed using apportioning. This enables individual amounts of solder paste to be applied at different contact points in a simple manner. Moreover, this method can be adapted very simply and flexibly to different batches to be processed.

To summarize, the following details and method steps result in the case of the inventive configuration and method. After masking the connection contacts that subsequently will be soldered, a preferably thin polymeric layer is applied in a plasma process. This polymeric layer cannot be wetted by solder and therefore functions as a soldering stop layer. The masking, which preferably includes solder paste, can be effected, for example, using screen printing, stencil printing or an apportioning method known per se. In this case, the flow behavior of the soldering paste is not significantly influenced by the thin polymer layer. As an alternative, the plasma polymer layer can also be produced after the application of the soldering paste and the contact-connection of the respective participants that are to be connected by soldering. The polymer layer thus performs the function of a soldering stop layer in the case of all participants.

The application of soldering stop resists or sheets is associated with great technological difficulties, in particular, in the case of participants with a high topography such as, for example, in the case of so-called MID (Molded Interconnect Devices) or CSP (Chip Size Packages) or wafer-level CSP with bumps. The alternative use of metals with different solder wettability requires a plurality of process steps, and is thus cost-intensive. Moreover, there is the increased risk of contact corrosion in the case of such configurations. Passages, so-called vias, at the contact connection points (so-called pads) are possible only in the case of multilayer circuits.

By contrast, complicated patterning steps of soldering stop resists or sheets are obviated in the case of masking with a solder paste. Moreover, the plasma polymer coating represents an effective corrosion protection. Furthermore, it is advantageous that all of the components that will be connected are provided with an effective soldering stop layer in a simultaneous process.

In the case of large scale integrated components—referred to as so-called wafer-level chip size packages—that are increasingly being used, bumps are provided, which are arranged in a regular structure on the semiconductor chip. Contact areas or contact connections are provided on these contact bumps. The contact areas or contact connections are connected to the contact pads of the chip. The pads are arranged in a line, by means of a rewiring. The contact pads and the rewiring may include, for example, a copper/nickel/gold metallization that is produced by electrodeposition and that is readily wettable by solder. These components must be contact-connected on printed circuit boards by soldering in order to produce so-called single inline memory modules (SIM modules). On the printed circuit board, solder paste deposits are produced by screen-printing or by dispensing them on the connection contacts. The components (wafer-level chip size packages) are emplaced and are then polymer coating using plasma polymerization.

In this case, the layer thickness may advantageously be between 5 and 50 nm. Depending on the prepolymers or gases used, it is possible to produce a multiplicity of organic compounds, for example teflon-like or silicone-like polymers.

The contacts of the SIM module toward the outside must be covered during the coating process, which can be done mechanically, for example. With thin layers, in the case of later connection to suitable plug contacts, reliable contact-connection is also possible despite the plasma polymerization layer, for example, by forming the plug contacts like blades so that they are able to cut or dig through the coating. Consequently, a covering during the coating is not necessary in this case. The customary soldering process can be effected after the plasma polymerization.

Other features which are considered as characteristic for the invention are set forth in the appended claims.

Although the invention is illustrated and described herein as embodied in a configuration having an electronic device electrically connected to a printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
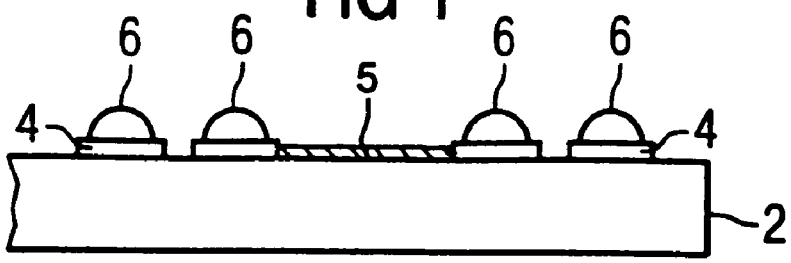
FIG. 1 is a diagrammatic illustration of a printed circuit board having a plurality of connection contacts with solder deposited thereon.

Referring now to the figures of the drawing in detail and first, particularly, to FIG. 1 thereof, there is shown a diagrammatic illustration of a planar printed circuit board 2 with a plurality of external contacts 4 that are arranged next to one another on the surface of the printed circuit board 2.

Small portions of soldering paste 6 have been applied on the external contacts 4. In a later process step, these external contacts 4 will be soldered with corresponding connecting contacts of a rewiring metallization of a semiconductor chip.

Figure 2:
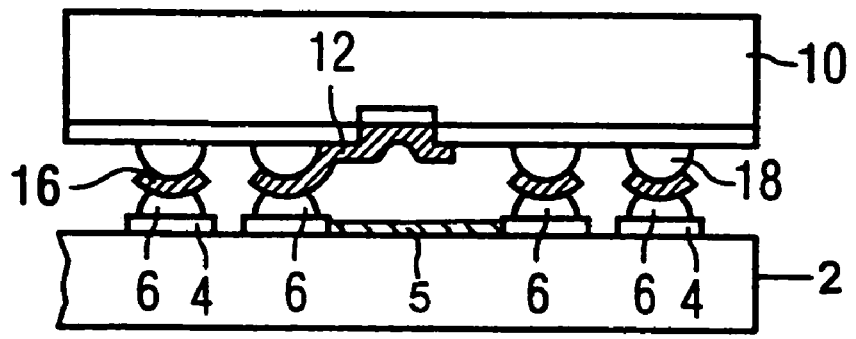
FIG. 2 is a diagrammatic illustration of an inventive configuration.

FIG. 2 shows a diagrammatic illustration of a semiconductor chip 10 with associated rewiring metallization 12. The semiconductor chip has already been positioned on the printed circuit board 2. On the side of the rewiring metallization 12 that is remote from the semiconductor chip 10, the rewiring metallization 12 is provided with contact connections 16 that correspond to the external contacts 4 on the printed circuit board 2.

Figure 3:
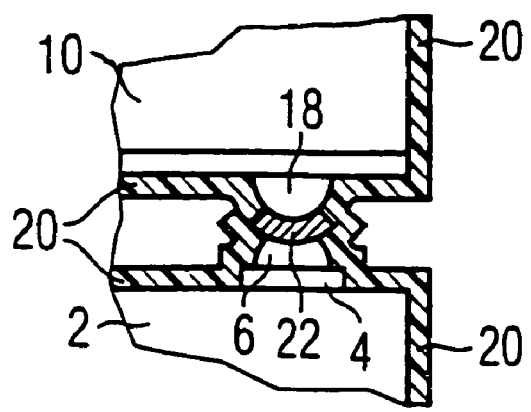
FIG. 3 shows a portion of the configuration shown in FIG. 2, after a plasma polymerization.

FIG. 3 shows a detail taken from the diagrammatic illustration shown in FIG. 2 with an exemplary contact-connection between the printed circuit board 2 and contact connections 16. A contact connection 16 is seated on a contact bump 18 having a hemispherical contour. The contact connection 16 may preferably have an elastically resilient configuration, in order to be able to compensate for unevennesses and slight level differences between the rewiring metallization 12 and the external contacts 4 of the printed circuit board 2. In the course of mounting, the spherical surface of the contact bump 18 is positioned largely centrally on the external contact 4 with the soldering paste 6 situated thereon.

A plasma-polymerized polymer layer 20 encapsulates the exposed surfaces. This polymer layer 20 can be applied either before or after joining together the soldering participants that will be connected. During the subsequent soldering of the external contacts 4 with the contact connection 16 or with the contact bump 18 situated thereon, the polymer layer 20 effectively prevents the liquefied solder from flowing away to the conductor tracks adjoining the external contacts 4.

A first embodiment of the inventive method is described below with reference to FIGS. 1 to 3. In the method for producing a configuration including at least one semiconductor chip 10 with associated rewiring metallization 12 and with contact connections 16 situated thereon, the contact connections 16 are connected to a printed circuit board 2 with external contacts (not illustrated here). First, the individual parts of the configuration that will be soldered are provided. In the exemplary embodiment illustrated, they are the semiconductor chip 10 with the contact bumps 18, the rewiring metallization 12 including contact connections 16, and the printed circuit board 2. On the printed circuit board 2, all of the external contacts 4 that will be soldered are masked with a soldering paste 6 using screen printing or stencil printing. The individual parts prepared in this way are subsequently introduced individually or jointly into a plasma chamber, where a polymer layer 20 is applied to the configuration by using plasma polymerization. Afterward, the configuration or the individual parts thereof are removed again from the plasma chamber. Finally, the electrical connections of the configuration are soldered to one another, thereby forming mechanically fixed and electrically conductive soldered connections between the contact connections 16 and the external contacts of the printed circuit board 2.

The second embodiment of the inventive method essentially corresponds to the first embodiment of the method. The second embodiment of the method deviates from the first embodiment of the method with regard to the following method steps. The contact bumps 18 are placed onto the external contacts 4 that have been provided with the soldering paste 6, resulting in a configuration that is joined together, but not yet soldered. Afterward, the polymer layer 20 is applied in the plasma chamber. This polymer layer encapsulates all of the parts, but not the areas of contact between the contact connections 16 and the soldering paste 6. The contacts are subsequently soldered, thereby forming mechanically fixed and electrically conductive soldered connections between the contact connections 16 and the external contacts of the printed circuit board 2.

We claim:

1. A method for producing a configuration having at least one electronic device that is electrically coupled to at least one printed circuit board, the method which comprises:
   providing a configuration having at least one electronic device with associated contact connections and at least one printed circuit board with external contacts;
   using a soldering paste to mask the external contacts;
   introducing the configuration into a plasma chamber;
   applying a polymer layer, at least to metallic surfaces of the configuration, using plasma polymerization;
   removing the configuration from the plasma chamber;
   if necessary, removing the polymer layer from the contacts of the printed circuit board and from the contact connections of the electronic device; and
   soldering the contacts of the printed circuit board and the contact connections of the electronic device together such that, in the configuration, the printed circuit board and the electronic device are electrically coupled together.

2. The method according to claim 1, which comprises:
   performing the step of applying the polymer layer by covering all surfaces of the at least one electronic device and all surfaces of the at least one printed circuit board with the polymer layer.

3. The method according to claim 1, which comprises:
   performing the step of applying the polymer layer such that during the plasma polymerization, monomers are polymerized in the plasma chamber to form longer-chain hydrocarbons.

4. The method according to claim 3, which comprises:
   performing the step of applying the polymer layer such that during the plasma polymerization, short-chain prepolymers are polymerized in the plasma chamber to form longer-chain hydrocarbons.

5. The method according to claim 1, which comprises:
   performing the step of applying the polymer layer such that during the plasma polymerization, short-chain prepolymers are polymerized in the plasma chamber to form longer-chain hydrocarbons.

6. The method according to claim 1, which comprises:
   screen printing the soldering paste to mask the connection contacts that will be soldered.

7. The method according to claim 1, which comprises:
   stencil printing the soldering paste to mask the connection contacts that will be soldered.

8. The method according to claim 1, which comprises:
   apportioning the soldering paste to mask the connection contacts that will be soldered.

9. A method for producing a configuration having at least one electronic device that is electrically coupled to at least one printed circuit board, the method which comprises:
   providing a configuration having at least one electronic device with associated contact connections and at least one printed circuit board with external contacts;
   using a soldering paste to mask the external contacts of the printed circuit board;

contact-connecting the contact connections of the electronic device to the external contacts of the printed circuit board;
introducing the configuration into a plasma chamber;
applying a polymer layer, at least to metallic surfaces of the configuration, using plasma polymerization;
removing the configuration from the plasma chamber; and
soldering the contacts of the printed circuit board and the contact connections of the electronic device together such that, in the configuration, the printed circuit board and the electronic device are electrically coupled together.

10. The method according to claim 9, which comprises:
performing the step of applying the polymer layer by covering all surfaces of the at least one electronic device and all surfaces of the at least one printed circuit board with the polymer layer.

11. The method according to claim 9, which comprises:
performing the step of applying the polymer layer such that during the plasma polymerization, monomers are polymerized in the plasma chamber to form longer-chain hydrocarbons.

12. The method according to claim 11, which comprises:
performing the step of applying the polymer layer such that during the plasma polymerization, short-chain pre-polymers are polymerized in the plasma chamber to form longer-chain hydrocarbons.

13. The method according to claim 9, which comprises:
performing the step of applying the polymer layer such that during the plasma polymerization, short-chain pre-polymers are polymerized in the plasma chamber to form longer-chain hydrocarbons.

14. The method according to claim 9, which comprises:
screen printing the soldering paste to mask the connection contacts that will be soldered.

15. The method according to claim 9, which comprises:
stencil printing the soldering paste to mask the connection contacts that will be soldered.

16. The method according to claim 9, which comprises:
apportioning the soldering paste to mask the connection contacts that will be soldered.

* * * * *